(12) United States Patent
Lee et al.

(10) Patent No.: US 7,098,702 B2
(45) Date of Patent: Aug. 29, 2006

(54) TRANSCONDUCTOR CIRCUIT FOR COMPENSATING THE DISTORTION OF OUTPUT CURRENT

(75) Inventors: Beaung Woo Lee, Daejeon (KR); Mun Yang Park, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 11 days.

(21) Appl. No.: 10/942,329

(22) Filed: Sep. 14, 2004

(65) Prior Publication Data

US 2005/0134328 A1    Jun. 23, 2005

(30) Foreign Application Priority Data

Dec. 23, 2003    (KR) .................. 10-2003-0095398

(51) Int. Cl.
*H03K 3/00* (2006.01)

(52) U.S. Cl. .................. 327/108; 327/563; 330/253

(58) Field of Classification Search ........ 327/108–112, 327/563; 330/252, 253
See application file for complete search history.

(56) References Cited

U.S. PATENT DOCUMENTS

| 4,390,848 | A | * | 6/1983 | Blauschild | .................. 330/151 |
|---|---|---|---|---|---|
| 5,182,477 | A | * | 1/1993 | Yamasaki et al. | ............. 327/65 |
| 5,578,965 | A | * | 11/1996 | Kimura | ...................... 330/254 |
| 5,598,117 | A | * | 1/1997 | Deguchi | ...................... 327/103 |
| 5,742,199 | A | * | 4/1998 | Shoji et al. | .................. 327/552 |
| 6,037,825 | A | * | 3/2000 | Kung | ........................ 327/359 |
| 6,242,980 | B1 | | 6/2001 | Tsukagoshi et al. | |
| 6,577,170 | B1 | | 6/2003 | Prodanov | |
| 6,768,442 | B1 | * | 7/2004 | Meyers et al. | ............. 341/158 |

OTHER PUBLICATIONS

IEEE Transactions on Circuits and Systems -II: Analog and Digital Signal Processing, vol. 44, No. 3, Mar. 1997, pp. 174-187.
IEEE Journal of Solid-State Circuits, vol. 25, No. 1, Feb. 1990, pp. 315-317.
Electronics Letters, Jun. 19, 1986, vol. 22, No. 13, pp. 721-722.

* cited by examiner

*Primary Examiner*—Kenneth B. Wells
(74) *Attorney, Agent, or Firm*—Blakely Sokoloff Taylor & Zafman

(57) ABSTRACT

Provided is a transconductor circuit for compensating distortion of an output current. The transconductor circuit is a differential pair with source degeneration and includes a main circuitry to which a predetermined input voltage is applied, constant current sources which supply the main circuitry with constant bias, an auxiliary circuitry which is connected to nodes of the main circuitry to compensate the distortion of the output current, and a variable current source which controls a depth or degree of a distortion compensation operation for the output current.

9 Claims, 4 Drawing Sheets

TRANSCONDUCTOR CIRCUIT FOR COMPENSATING THE DISTORTION OF OUTPUT CURRENT

BACKGROUND OF THE INVENTION

This application claims the priority of Korean Patent Application No. 2003-95398, filed on Dec. 23, 2003, in the Korean Intellectual Property Office, the disclosure of which is incorporated herein in its entirety by reference.

1. Field of the Invention

The present invention relates to a transconductor circuit, and more particularly, to a transconductor circuit including metal oxide semiconductor (MOS) transistors so as to prevent an output current from being distorted.

2. Description of the Related Art

In general, transconductors are circuits that convert a voltage into a current to process an electric signal. In other words, when a predetermined voltage is applied to the transconductors, the transconductors output a current value. Such a transconductor is generally used in an analog signal processor such as a filter, a gain control amplifier, or the like.

The transconductor is processed by a highly integrated analog signal and includes MOS or complementary MOS (CMOS) transistors that are generally driven at a low voltage. The MOS transistors have merits in that an input gate current does not flow, power consumption is low, and integration is high.

FIG. 1 is a circuit diagram of a conventional transconductor circuit. Referring to FIG. 1, a transconductor circuit 10 includes an input unit 20, an output unit 30, and current sources 40.

The input unit 20 is a differential pair and includes first and second MOS transistors M1 and M2 and a resistor R1. First and second input voltages Vinn and Vinp are applied to gates of the first and second MOS transistors M1 and M2, respectively. A source of the first MOS transistor M1 is electrically connected to a source of the second MOS transistor M2 via the resistor R1. Here, the input unit 20 serves as a main circuitry of the transconductor circuit 10. Since the input unit 20 is the differential pair with source degeneration and includes a pair of the first and second MOS transistors M1 and M2 as above-mentioned, the input unit 20 is advantageous to operation speed characteristics. Here, an output current is less distorted when the resistor R1 exists than when the resistor R1 does not exist.

The output unit 30 is a cascode amplifier in which gates of third and fourth MOS transistors M3 and M4 are commonly connected. A source of the third MOS transistor M3 is connected to a drain of the first MOS transistor M1, and a source of the fourth MOS transistor M4 is connected to a drain of the second MOS transistor M2. Predetermined electric loads (not shown) are connected to drains of the third and fourth MOS transistors M3 and M4 so as to allow the output current to flow through the transconductor circuit 10. A power voltage Vdc is applied to gates of the third and fourth MOS transistors M3 and M4.

The current sources 40 are respectively connected between the first MOS transistor M1 and ground and between the second MOS transistor M2 and ground to supply the first and second MOS transistors M1 and M2 with constant bias.

It preferable that a gate-source voltage Vgs of the first and second MOS transistors M1 and M2 is low and transconductances gm of the first and second MOS transistors M1 and M2 are high in order to drive the transconductor circuit 10 at a low voltage. Also, it is preferable that gate-drain capacitances Cgd of the first and second MOS transistors M1 and M2 are low to improve fast operation characteristics. Moreover, the first and second MOS transistors M1 and M2 are preferably designed so that channel lengths are short and ratios of channel widths to channel lengths are great.

A transconductance Gm of the transconductor circuit 10 is a variation in the output current with respect to an input voltage and can be represented as in Equation:

$$Gm = \frac{d(Iout)}{d(Vin)} \qquad (1)$$

wherein Iout denotes the output current that is a difference (Iop−Ion) between a second current Iop and a first current Ion and Vin denotes the input voltage that is a difference (Vinp−Vinn) between the second input voltage Vinp and the first input voltage Vinn.

In the transconductor circuit 10, the first and second input voltages Vinn and Vinp applied to the first and second MOS transistors M1 and M2 of the input unit 20 vary the first and second currents Ion and Iop. Here, the output unit 30 is connected to an output node of the input unit 20 to increase entire output resistance in the transconductor circuit 10.

The transconductance Gm of the transconductor circuit 10 must be constant regardless of the intensity of the input voltage Vin. However, as shown in FIG. 2, the transconductance Gm of the transconductor circuit 10 gradually decreases when an absolute value of the input voltage Vin increases to a constant voltage or more. This means that the output current Iout of the transconductor circuit 10 is distorted.

The distortion of the output current Iout is generally caused by the nonlinear characteristics of the first and second MOS transistors M1 and M2 resulting from a power voltage and a bias current value generated from the power voltage. The distortion of the output current Iout may be considerably reduced by increasing the magnitude of the resistor R1 of the input unit 20.

However, the increase in the magnitude of the resistor R1 results in increasing the size of semiconductor chips and parasitic capacitance, which deteriorates integration density and operation speed.

Although the magnitude of the resistor R1 increases, the nonlinear characteristics of the first and second MOS transistors M1 and M2 and the current sources 40 do not vary. Also, as shown in FIG. 2, as the input voltage Vin of the transconductor circuit 10 gets close to a maximum input voltage Vmax, the distortion of the output current Iout becomes more serious. Furthermore, when the output current Iout is distorted, a region in which the output current Iout linearly increases is reduced.

SUMMARY OF THE INVENTION

According to an aspect of the present invention, there is provided a transconductor circuit for compensating distortion of an output current.

The transconductor circuit includes a main circuitry to which a predetermined input voltage is applied, constant current sources which supply the main circuitry with constant bias, an auxiliary circuitry which is connected to nodes of the main circuitry to compensate the distortion of the output current, and a variable current source which controls a depth or degree of a distortion compensation operation of the output current. When an absolute value of a total input voltage is less than a constant voltage, the auxiliary circuitry includes MOS transistors that operate in sub-threshold regions. When the absolute value of the total input voltage is more than the constant voltage, the auxiliary circuitry includes MOS transistors that operate in saturation regions. The auxiliary circuitry contributes to compensating distortion of a total output current of the transconductor circuit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
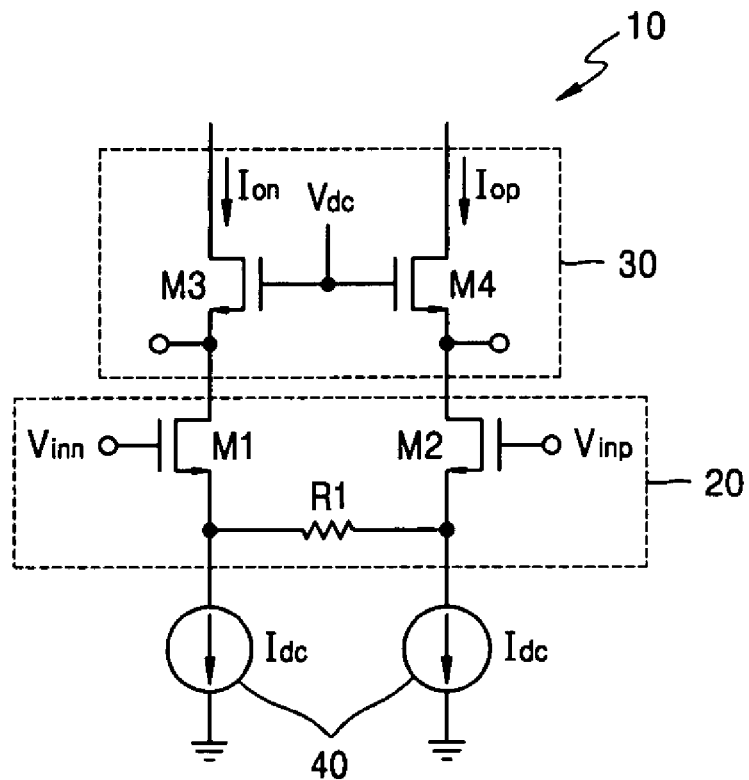
FIG. 1 is a circuit diagram of a conventional transconductor circuit.
Figure 2:
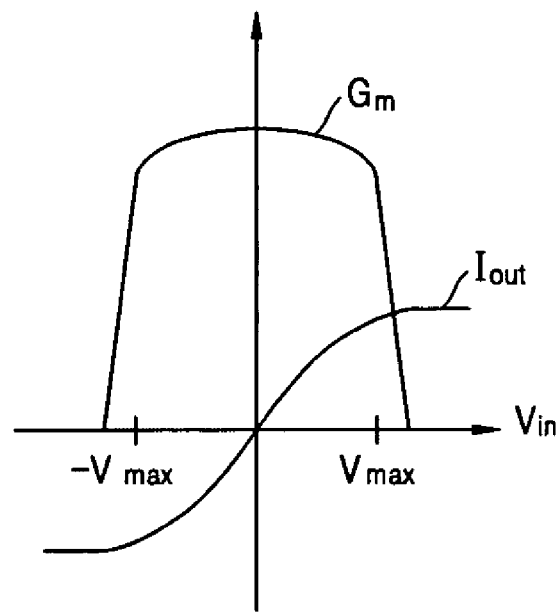
FIG. 2 is a graph for showing transconductance of the transconductor circuit of FIG. 1.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Figure 3:
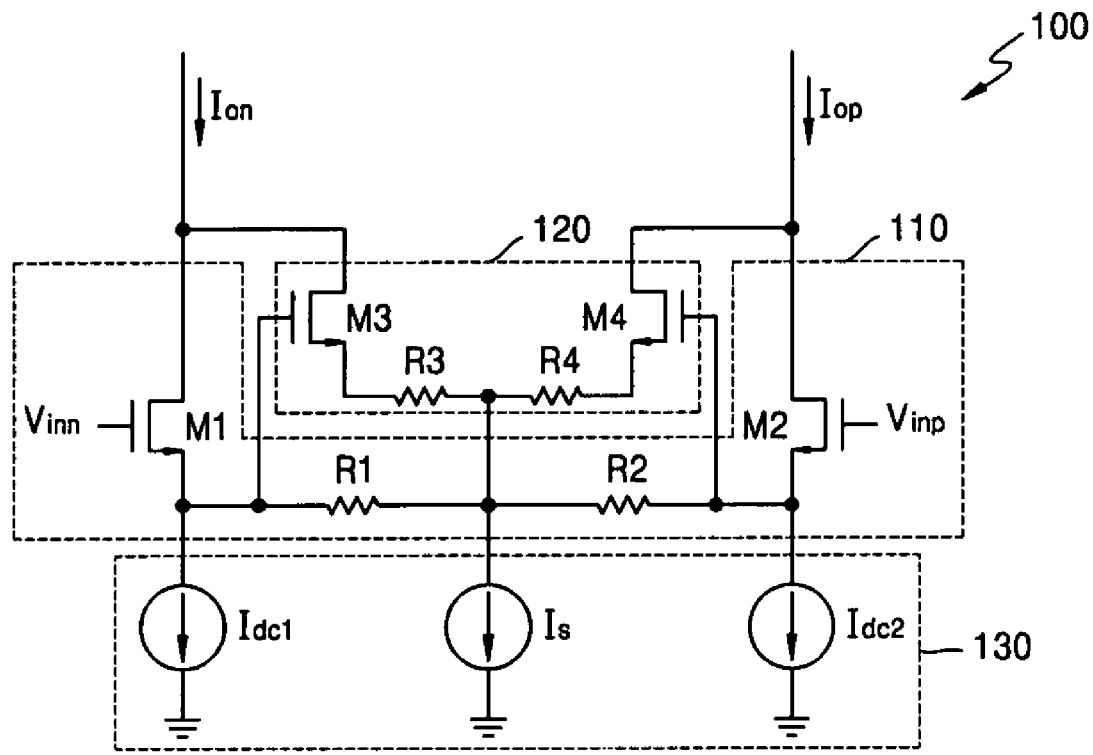
FIG. 3 is a circuit diagram of a transconductor circuit, according to an embodiment of the present invention.

FIG. 3 is a circuit diagram of a transconductor circuit, according to an embodiment of the present invention. Referring to FIG. 3, a transconductor circuit 100 includes a main circuitry 110, an auxiliary circuitry 120, and a current source 130.

The main circuitry 110 is a differential pair with source degeneration. The main circuitry 110 includes first and second MOS transistors M1 and M2 and first and second resistors R1 and R2. First and second input voltages Vinn and Vinp are applied to gates of the first and second MOS transistors M1 and M2, respectively. Sources of the first and second MOS transistors M1 and M2 are electrically interconnected via the first and second resistors R1 and R2. Predetermined loads (not shown) are connected to drains of the first and second MOS transistors M1 and M2 to allow an output current to flow through the transconductor circuit 100. The current source 130 supplies the first and second MOS transistors M1 and M2 with bias currents. The magnitude of the first and second resistors R1 and R2 may be arbitrarily controlled by a designer, for example, may be about several Ω to millions Ω. An input voltage Vin of the transconductor circuit 100 is a difference between the second input voltage Vinp and the first input voltage Vinn, and an output current Iout of the transconductor circuit 100 is a difference between a second output current Iop and a first output current Ion.

The auxiliary circuitry 120 includes third and fourth MOS transistors M3 and M4 and third and fourth resistors R3 and R4. In more detail, a gate of the third MOS transistor M3 is connected to a source of the first MOS transistor M1, a source of the third MOS transistor M3 is connected to the third resistor R3, and a drain of the third MOS transistor M3 is connected to a drain of the first MOS transistor M1. A gate of the fourth MOS transistor M4 is connected to a source of the second MOS transistor M2, a source of the fourth MOS transistor M4 is connected to the fourth resistor R4, and a drain of the fourth MOS transistor M4 is connected to a drain of the second MOS transistor M2. The third and fourth resistors R3 and R4 are electrically interconnected. Also, a node to which the third and fourth resistors R3 and R4 are commonly connected is connected to a node to which the first and second resistors R1 and R2 are commonly connected, so that the first, second, third, and fourth resistors R1, R2, R3, and R4 are interconnected. Here, the magnitude of the third and fourth resistors R3 and R4 may be arbitrarily controlled by the designer, for example, may be several Ω to millions Ω.

The current source 130 includes first and second direct current (DC) sources Idc1 and Idc2 and a variable current source Is. The first DC source Idc1 is connected between the source of the first MOS transistor M1 and a ground node, and the second DC source Idc2 is connected between the source of the second MOS transistor M2 and a ground node. The variable current source Is is connected between the node to which the first, second, third, and fourth resistors R1, R2, R3, and R4 are commonly connected and ground.

There will now be explained the bias status of the entire transconductor circuit 100 when the input voltage Vin (Vinp−Vinn) is "0". The first and second DC sources Idc1 and Idc2 supply the first and second MOS transistors M1 and M2 with constant bias so that the first and second MOS transistors M1 and M2 operate in their saturation regions. A bias value of the variable current source Is is determined so that the third and fourth MOS transistors M3 and M4 operate in sub-threshold regions. In other words, the bias value of the variable current source Is is determined so that gate-source voltages Vgs of the third and fourth MOS transistors M3 and M4 are slightly lower than a threshold voltage Vth.

The operation of the transconductor circuit 100 will now be explained.

Figure 4:
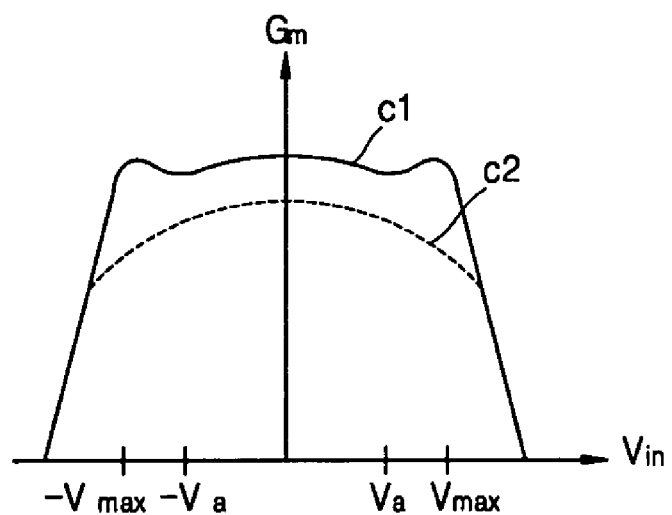
FIG. 4 is a graph for showing transconductance of the transconductor circuit of FIG. 3.

As shown in FIGS. 3 and 4, when an absolute value of the input voltage Vin of the transconductor circuit 100 is smaller than a constant voltage Va, the first and second MOS transistors M1 and M2 operate in their saturation regions, and the third and fourth MOS transistors M3 and M4 operate in the sub-threshold regions. A current of fine intensity then flows through the third and fourth resistors R3 and R4. Bias supplied by the variable current source Is is largely distributed to the first and second resistors R1 and R2, and a current flowing through the third and fourth MOS transistors M3 and M4 hardly affects an entire output current.

When the input voltage Vin is greater than the constant voltage Va, the second input voltage Vinp increases more than the first input voltage Vinn. Thus, a current flowing through the second resistor R2 connected to the second MOS transistor M2 increases. As a result, the gate-source voltage Vgs of the fourth MOS transistor M4 increases, and thus the fourth MOS transistor M4 enters the saturation region. A drain current of the fourth MOS transistor M4 in the saturation region increases more than when the input voltage Vin is "0". Thus, the output current Iout of the transconductor circuit 100 increases more than when the auxiliary circuitry 120 does not exist. As a result, transconductance Gm of the transconductor circuit 100 remains constant, and thus the distortion of the output current Iout is compensated. Here, the third MOS transistor M3 operates in the stronger sub-threshold region and a current flowing through the third MOS transistor M3 is fine, which hardly affects the entire output current.

In other words, as marked with "C2" of FIG. 4, the transconductance Gm of the conventional transconductor circuit 10 is considerably reduced when the input voltage Vin is greater than the constant voltage Va. However, in the present invention, when the auxiliary circuitry 120 is connected to an output node (drain node) of the main circuitry 110 and the input voltage Vin of the transconductor circuit 100 is greater than the constant voltage Va, the transconductance Gm of the transconductor circuit 100 remains almost constant as marked with "C1" of FIG. 4. As a result, the distortion of the output current is compensated.

When the magnitude of the third and fourth resistors R3 and R4 is relatively low, i.e., several Ω, channel lengths of the third and fourth MOS transistors M3 and M4 are too short, and the absolute value of the input voltage Vin is greater than the constant voltage Va, drain currents of the third and fourth MOS transistors M3 and M4 vary sharply. This may cause the output current to be distorted. Therefore, the channel lengths of the third and fourth MOS transistors M3 and M4 and the magnitude of the third and fourth resistors R3 and R4 must be determined in consideration of the value of the transconductance Gm.

When the input voltage Vin increases in a positive direction to be greater than a maximum input voltage Vmax, all bias currents generated by the current source 130 flow through the second and fourth MOS transistors M2 and M4, and currents do not flow through the first and third MOS transistors M1 and M3 any longer. Thus, the transconductance Gm, which is a variation in the output current, approaches "0". When the input voltage Vin increases in a negative direction, the similar results may be obtained.

Here, the value of the variable current source Is satisfies both the following two cases. When the absolute value of the input voltage Vin is smaller than the constant voltage Va, the value of the variable current source Is is set so that the third and fourth MOS transistors M3 and M4 operate in the sub-threshold regions. When the absolute value of the input voltage Vin is greater than the constant voltage Va, the value of the variable current source Is is set so that at least one of the third and fourth MOS transistors M3 and M4 necessarily operates in the saturation region.

Here, the constant voltage Va can be represented relative to the variable current source Is as in Equation 2:

$$(0.5Is + Gm \cdot Va)R2 = Vth4 \quad (2)$$

wherein Vth4 denotes a threshold voltage of the fourth MOS transistor M4. Here, the threshold voltage Vth4 of the fourth MOS transistor M4 is equal to a threshold voltage of the third MOS transistor M3, and values of the resistors R1 and R2 are equal. In a simulation according to an aspect of the present invention, the constant voltage Va is about ¾ of the maximum input voltage Vmax when the distortion of the entire output current is minimum. As a result, a linear region in which the output current Iout linearly increases is greatly improved.

Figure 5:
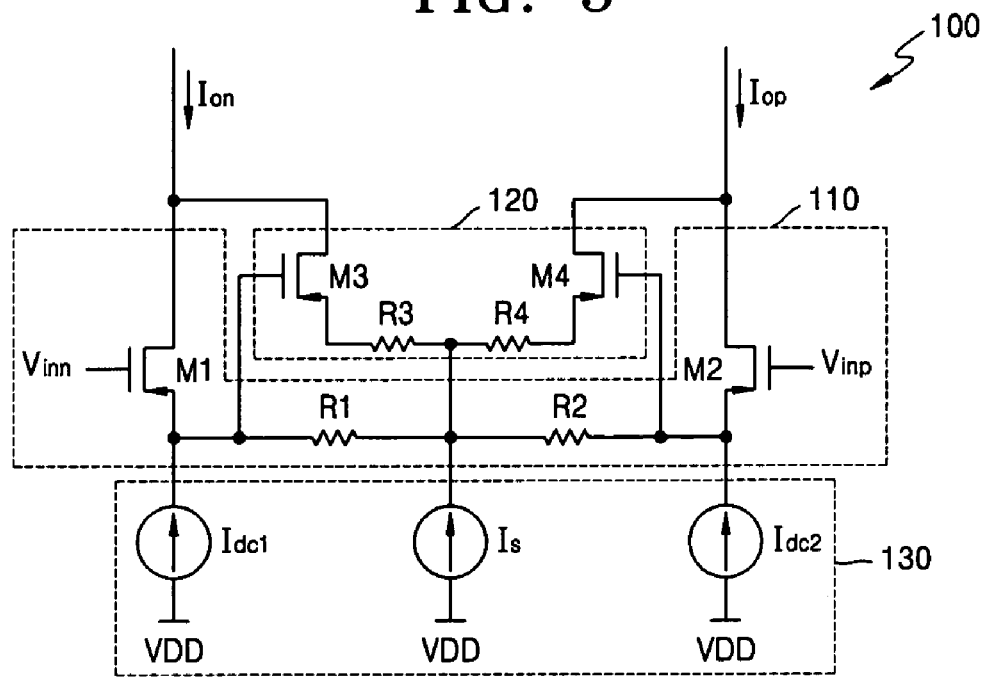
FIG. 5 is a circuit diagram of a transconductor circuit, according to another embodiment of the present invention.

The first, second, third, and fourth MOS transistors M1, M2, M3, and M4 of the transconductor circuit 100 of FIG. 3 are n-channel MOS (NMOS) transistors. However, as another aspect, as shown in FIG. 5, the first, second, third, and fourth MOS transistors M1, M2, M3, and M4 may be p-channel MOS (PMOS) transistors. In this case, polarities of the first and second DC sources Idc1 and Idc2, the variable current source Is, and voltage supply sources (a power voltage VDD and ground) must be changed into opposite polarities. As another aspect, the current source 130 may have a simple structure including MOS circuits.

Figure 6:
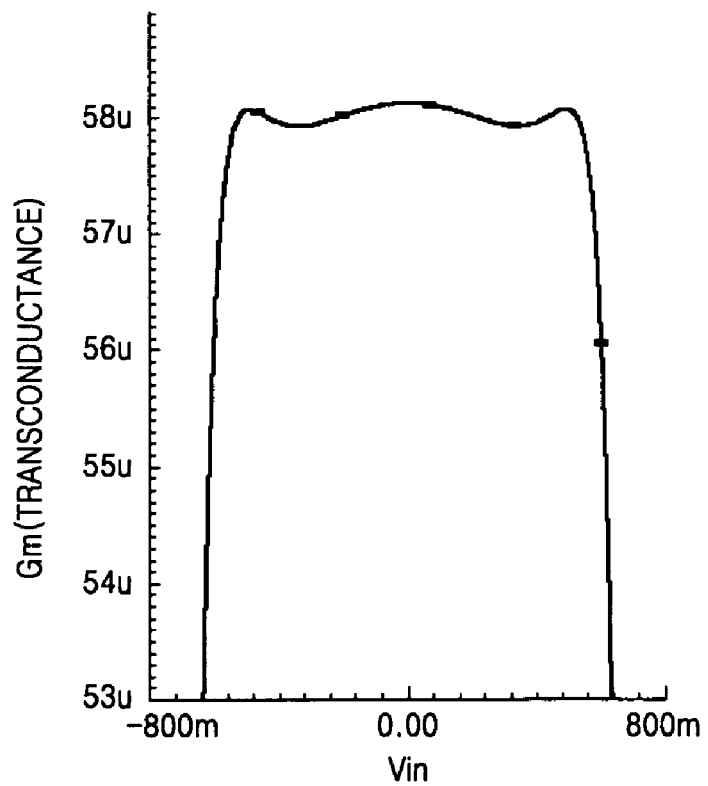
FIG. 6 is a graph for showing the results of a simulation for transconductance of the transconductor circuit of FIG. 5.

FIG. 6 is a graph for showing the results of a simulation for the transconductance Gm of the transconductor circuit 100. The simulation was carried out in conditions that a power voltage of 1.8V was applied and an input DC voltage of the transconductor circuit 100 is biased by about 0.9V. A curve of the transconductance Gm of FIG. 6 has the almost same shape as a curve of the transconductance Gm of FIG. 3. This indicates that the auxiliary circuitry 120 prevents the output current Iout from being distorted.

Figure 7:
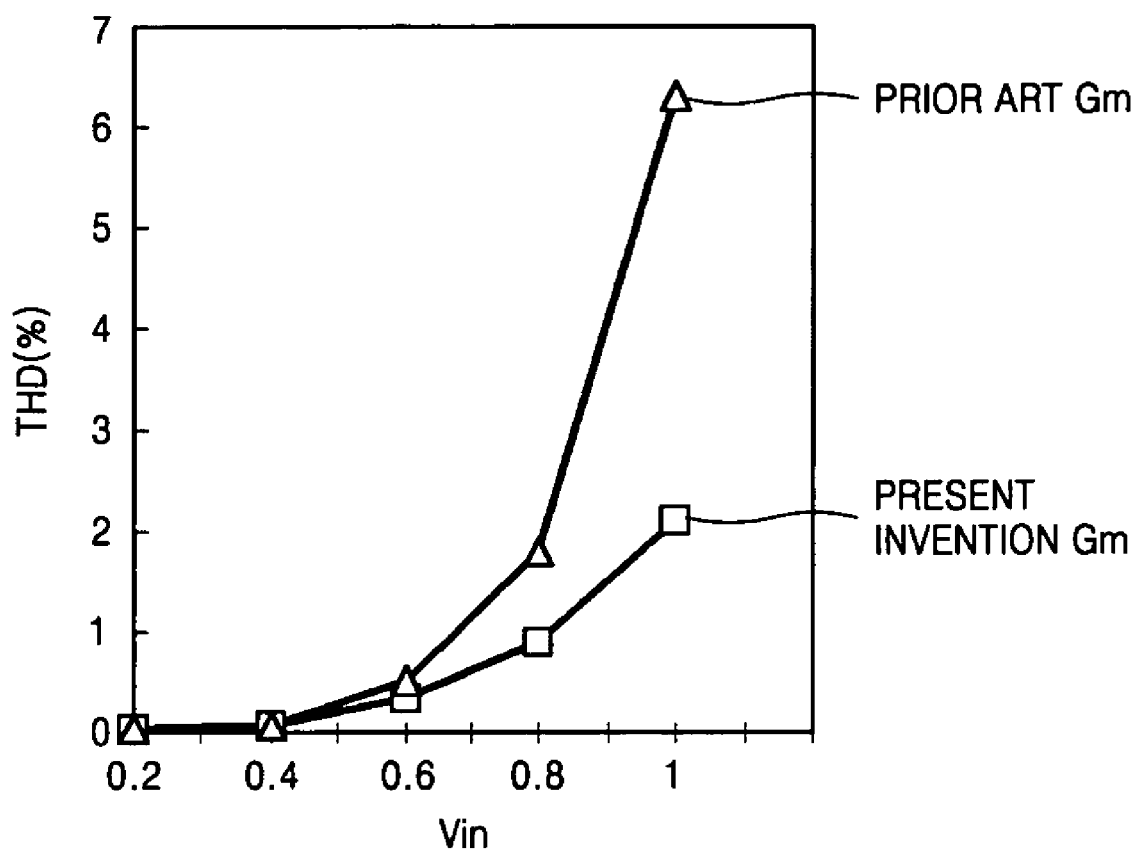
FIG. 7 is a graph for showing the results of a simulation for the distortion characteristics of an output current of a transconductor circuit according to the present invention.

FIG. 7 is a graph for showing the results of a simulation for the distortion characteristics of the transconductor circuit 100. In the simulation, an input frequency was set to 5 MHz, and a differential sine wave was input between the first and second input voltages Vinn and Vinp. The distortion characteristics will be described with total harmonic distortion (THD) of an output current that was analyzed in a frequency domain under the above conditions. As can be seen in FIG. 7, as the input voltage Vin increases, the transconductance Gm of the transconductor circuit 100 according to the present invention has a smaller THD value than the transconductance Gm of the conventional transconductor circuit 10. This indicates that the distortion of the output current of the transconductor circuit 100 is reduced.

As described above, in a transconductor circuit according to the present invention, an auxiliary circuitry is connected to an output node of a main circuitry that is a differential pair with source degeneration.

The auxiliary circuitry includes a pair of MOS transistors and a pair of resistors and is designed so as to operate in a sub-threshold region at less than a constant input voltage and in a saturation region at more than the constant input voltage. Thus, a reduction in the linearity of an output current of the main circuitry can be compensated at more than the constant input voltage. As a result, the distortion of the output current of the transconductor circuit can be prevented and a section in which the output current linearly increases can increase. Moreover, since the auxiliary circuitry includes the pair of MOS transistors and the pair of resistors, the auxiliary circuitry can have a quite simple structure. Thus, chips cannot occupy the large area and an operation speed cannot be lowered.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A transconductor circuit comprising:
   a main circuit comprising a first MOS transistor, a second MOS transistor connected to the first MOS transistor in differential pair arrangement, and first and second resistors connected between sources of the first and second MOS transistors;
   an auxiliary circuit comprising a third MOS transistor connected to a drain of the first MOS transistor and a fourth MOS transistor connected to a drain of the second MOS transistor, the third and fourth MOS transistors being electronically interconnected; and a plurality of current sources which supply main and the auxiliary circuits with bias currents, wherein a first input voltage is applied to a gate of the first MOS transistor of the main circuit;

a second input voltage is applied to a gate of the second MOS transistor;

an input voltage is a difference between the first and second input voltages;

the auxiliary circuit is designed so that the third and fourth MOS transistors operate in sub-threshold regions when the input voltage is within a first range between a negative constant voltage—Va and a positive constant voltage Va, and so that one of the third and fourth MOS transistors operates in a saturation region when the input voltage is within a second range between less than the negative constant voltage—Va and more then the positive constant voltage Va;

a gate of the third MOS transistor is connected to the source of the first MOS transistor and a drain of the third MOS transistor is connected to the drain of the first MOS transistor; and a gate of the fourth MOS transistor is connected to the source of the second MOS transistor and a drain of the fourth MOS transistor is connected to the drain of the second MOS transistor.

2. The transconductor circuit of claim 1, wherein:

a source of the third MOS transistor is electronically connected to a source of the fourth MOS transistor.

3. The transconductor circuit of claim 2, wherein third and fourth resistors are serially connected between the sources of the third and fourth MOS transistors.

4. The transconductor circuit of claim 3, wherein a node to which the first and second resistors are commonly connected is connected to a node to which the third and fourth resistors are commonly connected.

5. The transconductor circuit of claim 1, wherein the first and second MOS transistors are NMOS or PMOS transistors.

6. The transconductor circuit of claim 1, wherein the third and fourth MOS transistors are NMOS or PMOS transistors.

7. The transconductor circuit of claim 1, wherein the plurality of current sources comprise:

constant sources connected to the main circuit; and a variable current source connected to the auxiliary circuit.

8. The transconductor circuit of claim 1, wherein the current source comprises:

a first constant current source connected to the source of the first MOS transistor;

a second constant current source connected to the source of the second MOS transistor; and a variable current source connected to a node to which the first, second, third, and fourth resistors are commonly connected.

9. The transconductor circuit of claim 8, wherein variable current source controls an extent of distortion of an output current.

* * * * *